(12) United States Patent
Wendl et al.

(10) Patent No.: US 12,344,785 B2
(45) Date of Patent: Jul. 1, 2025

(54) NITRIDOPHOSPHATE PHOSPHORS FOR SOLID STATE LIGHTING AND METHOD OF PRODUCTION

(71) Applicant: Lumileds LLC, San Jose, CA (US)

(72) Inventors: Sebastian Wendl, Aachen (DE); Peter Josef Schmidt, Aachen (DE); Wolfgang Schnick, Aachen (DE)

(73) Assignee: Lumileds LLC, San Jose, CA (US)

( * ) Notice: Subject to any disclaimer, the term of this patent is extended or adjusted under 35 U.S.C. 154(b) by 215 days.

(21) Appl. No.: 17/909,815

(22) PCT Filed: Mar. 12, 2021

(86) PCT No.: PCT/US2021/022053
§ 371 (c)(1),
(2) Date: Sep. 7, 2022

(87) PCT Pub. No.: WO2021/183847
PCT Pub. Date: Sep. 16, 2021

(65) Prior Publication Data
US 2023/0383182 A1    Nov. 30, 2023

(30) Foreign Application Priority Data
Mar. 12, 2020  (EP) .................................... 20162632

(51) Int. Cl.
*C09K 11/77*  (2006.01)
*H10H 20/851*  (2025.01)

(52) U.S. Cl.
CPC ...... *C09K 11/7739* (2013.01); *C09K 11/7738* (2013.01); *H10H 20/8512* (2025.01)

(58) Field of Classification Search
CPC ............ C09K 11/7739; C09K 11/7738; H01L 33/502
See application file for complete search history.

(56) References Cited

U.S. PATENT DOCUMENTS

| 9,011,719 B2 | 4/2015 | He et al. |
| 2007/0181895 A1 | 8/2007 | Nagai et al. |
| 2013/0234588 A1 | 9/2013 | Seto et al. |
| 2015/0034923 A1 | 2/2015 | Kim et al. |

(Continued)

FOREIGN PATENT DOCUMENTS

| CN | 102925149 | * | 2/2013 |
| CN | 106244144 | * | 12/2016 |
| CN | 106244144 A | | 12/2016 |

(Continued)

OTHER PUBLICATIONS

Marchuk et al, "M2PO3N:ortho-oxonitridophosphates with b-K2So4 Structure Type", Inorganic Chemistry, 2016, 55, pp. 974-982, 12 /24/15.*

(Continued)

*Primary Examiner* — C Melissa Koslow

(57) ABSTRACT

A method of forming a nitridophosphate is disclosed, the method including forming a precursor mixture by combining a metal source material, a phosphorus source material, and a nitrogen source material, and heating the precursor mixture at a maximum temperature between 800° C. and 1300° C. in an atmosphere including nitrogen gas at a pressure between 2 MPa and 500 MPa.

16 Claims, 19 Drawing Sheets

(56) References Cited

U.S. PATENT DOCUMENTS

2016/0028105 A1     1/2016    Khalifah et al.

FOREIGN PATENT DOCUMENTS

| CN | 106634996 | * | 5/2017 |
| CN | 106634996 A | | 5/2017 |
| EP | 2180031 A1 | | 4/2010 |
| KR | 10-2012-0063923 | * | 6/2012 |
| KR | 10-2012-0063923 A | | 6/2012 |
| WO | 2021/183847 A1 | | 9/2021 |

OTHER PUBLICATIONS

Translation for CN 106634996, May 10, 2017.*

Translation for CN 106244144, Dec. 21, 2016.*

Translation for KR 10-2012-0063923, Jun. 18, 2012.*

The extended European search report, EP21768619.5, May 16, 2024, 12 pages.

From the USPTO as the ISA, Notification of Transmittal of the International Search Report and the Written Opinion of the International Searching Authority, or the Declaration, PCT/US2021/022053, Jun. 28, 2021, 10 pages.

The extended European Search Report, EP20162632.2, Jul. 21, 2020, 9 pages.

Marchuk et al., "Ba3P5N10Br:Eu2+: A Natural-White-Light Single Emitter with a Zeolite Structure Type", Angewandte Chemie International Edition, vol. 54, No. 8, Feb. 16, 2015, pp. 2383-2387.

Kloss et al., "Nitridophosphates: A Success Story of Nitride Synthesis", Angewandte Chemie International Edition, vol. 58, No. 24, Jun. 11, 2019, pp. 7933-7944.

Pucher et al., "Luminescent Nitridophosphates CaP2N4:Eu2+, SrP2N4:Eu2+, BaP2N4:Eu2+, and BaSr2P6N12:Eu2+", Chemistry—A European Journal, vol. 21, No. 17, Apr. 20, 2015, pp. 6443-6448.

Marchuk et al., "Nontypical Luminescence Properties and Structural Relation of Ba3P5N10X:Eu2+ (X=Cl, I): Nitridophosphate Halides with Zeolite-like Structure," Chemistry of Materials, 2015, vol. 27, 6432-6441, DOI: 10.1021 / acs.chemmater.5b02668, 10 pages.

Marchuk et al., "Ba3P5N10Be: Eu2+: A Natural-White-Light Single Emitter with a Zeolite Structure Type", Angew. Chem. Int. Ed., 2015, vol. 54, pp. 2383-2387 (Jan. 8, 2015).

* cited by examiner

100

```
┌─────────────────────────────┐
│ Combine Precursor Materials │   S110
└──────────────┬──────────────┘
               ▼
┌─────────────────────────────────┐
│ Heat Mixture of Precursor Materials │
│ under Nitrogen Gas at a Moderate,   │   S120
│ Isostatic Gas Pressure              │
└──────────────┬──────────────────┘
               ▼
┌─────────────────────────────┐
│ Cool to Room Temperature and │   S130
│ Pressure                     │
└─────────────────────────────┘
```

FIG. 1

NITRIDOPHOSPHATE PHOSPHORS FOR SOLID STATE LIGHTING AND METHOD OF PRODUCTION

CROSS REFERENCE TO RELATED APPLICATIONS

This is a 371 national phase application of International Application No. PCT/US2021/022053 filed Mar. 12, 2021 which claims priority to and benefit of European Patent Application No. 20162632.2 titled "NITRIDOPHOSPHATE PHOSPHORS FOR SOLID STATE LIGHTING AND METHOD OF PRODUCTION" filed Mar. 12, 2020. Each of the foregoing applications is incorporated herein by reference in its entirety.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Nitridophosphates include compounds with the structure M-P—N—O—X, where M is a metal and X is a halide. Such nitridophosphates, have been reviewed in detail recently by S. D. Kloß and W. Schnick (*Nitridophosphates: A Success Story of Nitride Synthesis*, Angew. Chem. Int. Ed. 2019, 58, 7933-7944). Luminescent nitridophosphates that were obtained on a small scale in a mulitanvil apparatus at pressures in the GPa range are described in Marchuk et al. (*Nontypical Luminescence Properties and Structural Relation of $Ba_3P_5N_{10}X:Eu^{2+}$ (X Cl, I): Nitridophosphate Halides with Zeolite-like Structure*, Chem. Mater 2015, 27, 6432-6441) and Pucher et al. (*Luminescent Nitridophosphates $CaP_2N_4:Eu^{2+}$, $SrP_2N_4:Eu^{2+}$, $BaP_2N_4:Eu^{2+}$, and $BaSr_2P_6Ni_2:Eu^{2+}$*, Chem. Eur. J. 2015, 21, 6443-6448).

BRIEF DESCRIPTION OF THE DRAWINGS

FIG. 1 illustrates a method for commercial scale production of nitridophosphates, including nitridophosphate phosphors.

DETAILED DESCRIPTION

Figure 2:
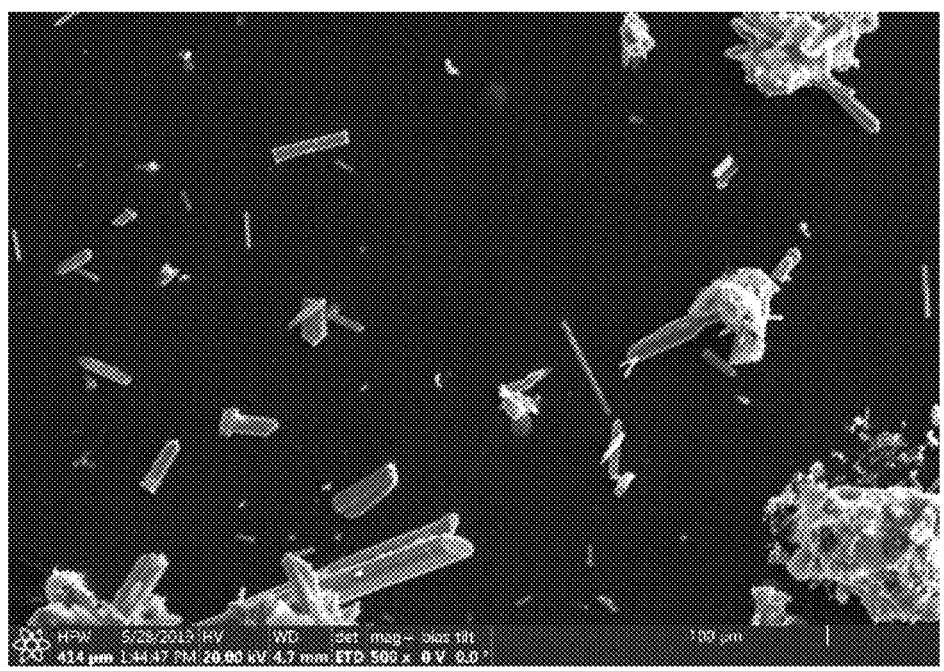
FIG. 2 is a scanning electron microscope ("SEM") image of the $Ca_2PN_3$:Eu obtained from Example 2.

This specification discloses an industrial production method for making nitridophosphates, including nitridophosphate phosphors, and novel nitridophosphate phosphors for use in pcLEDs.

As used herein, the term "nitridophosphate" means a crystalline substance that has P—N bonds and tetrahedral building blocks with phosphor as the center atom and at least one nitrogen atom at the vertices of the tetrahedral. Nitridophosphates include, for example, $M_aP_bN_xO_yX_z$ where M is a metal or combinations of metals, for example, a rare earth or alkali metal, and X is a halide. For example, nitridophosphates include $M_aP_bN_xO_yX_z$ where M=Ca, Sr, Ba, Eu, Ce, La, Y, and/or Lu; and X=F, Cl, Br, or I; a>0, b>0, x>0, y>0 and z≥0. Specific nitridophosphates include, for example, $SrP_3N_5O$, $Ba_6P_{12}N_{17}O_9Br$, $MP_2N_4$ (M=Sr, Ba), and $Ba_3P_5N_{10}X$ (X=Cr, Br, I).

Such nitridophosphates may be used as a host lattice material for solid state lighting phosphors. As used herein, the term "nitridophosphate phosphor" means a nitridophosphate as defined above and including a dopant such that the resulting material is luminescent. In nitridophosphate phosphors the $P(N,O)_4$ tetrahedral building blocks in the host lattice structure can be further connected with other tetrahedral building blocks by means of vertex, edge, or face sharing. Nitridophosphate phosphors include, for example, $M_aP_bA_qN_rO_yX_z$:D, where D is a dopant, M and X are as defined above, A=Al and/or Si, and a>0, b>0, r>0, q≥0, y≥0 and z≥0. Dopant D may include, for example, $Eu^{2+}$ and $Ce^{3*}$. Examples of novel nitridophosphate phosphors include, for example, $Ca_2PN_3$:Eu and $Sr_3P_5N_{10}$X:Eu (where X=Cl, Br), and examples also include $MLi_3PO_2N_2$:Eu, $MLiMg_2PN_4$:Eu, $MLi_2AlPN_4$:Eu, $M_2Li_5P_3N_8$:Eu, $MLi_2Al_3PN_6$:Eu, $MLi_2Be_2P_2N_6$:Eu, $MLi_4P_2N_4$:Eu, $M_2AlPSi_3N_8$:Eu, $M_3P_6O_6N_8$:Eu (M=Ca, Sr, Ba), $CaP_2N_4$:$Eu^{2+}$, Ba $P_2N_4$:$Eu^{2+}$, Sr $P_2N_4$:$Eu^{2+}$, and $BaSr_2P_6N_{12}$:$Eu^{2+}$.

Method

Previously, nitridophosphates, including nitridophosphate phosphors could only be synthesized by applying high ammonia gas pressures, by using ammonothermal synthesis conditions, and/or under nitrogen pressures exceeding 1 GPa in multianvil-type presses, with the resulting sample volumes not exceeding a few $cm^3$. Using such methods, synthesis of nitridophosphates was limited to a small scale and costs were high, limiting their potential commercial applications. The method disclosed herein allows for the cost effective, large scale synthesis of nitridophosphate phosphors.

FIG. 1 illustrates a method 100 for commercial scale production of nitridophosphates, including nitridophosphate phosphors. At S110, the nitridophosphate precursor materials are combined to form a precursor mixture. Such nitridophosphate precursor materials may include a metal source material for M, a phosphorous source material for P, and a nitrogen source material for N, and may further include an oxygen (when y>0 in the desired nitridophosphate), an aluminum and/or silicon source material (for A, when q>0) in the desired nitridophosphate), a halide source material (for X, when z>0 in the desired nitridophosphate). When the desired compound is a nitridophosphate phosphor, a dopant source material for D is also included in the precursor mixture.

Metal source materials may include, for example, metal azides, metal nitrides, metal hydrides, and/or metal halides.

Phosphorus source materials may include, for example, elemental phosphorus, such as red phosphorus, as well as $PN_4$, PON, and/or $P_3N_5$. It was an unexpected result that the method disclosed herein can successfully synthesize nitridophosphate compounds using elemental (red) phosphorous as a phosphorous precursor source material. Use of triphosphorous pentanitride, $P_3N_5$, as the phosphorus precursor source material may be limited because synthesis of $P_3N_5$ may be difficult to achieve in commercial quantities.

The nitrogen source material may be provided as the counter ion with the metal source material compound, for instance with a metal azide or metal nitride, and/or in the compound with the phosphorous source material, for instance with $HPN_2$, $HP_4N_7$, PON, and/or $P_3N_5$. The nitrogen source may also be nitrogen gas.

When y>0, an oxygen source material may be provided as part of the phosphorous source material compound and/or nitrogen source material compound, e.g. PON and/or phosphates such $Li_3PO_4$, $(NH_4)_2HPO_4$, $NH_4H_2PO_4$, $CaHPO_4$, $SrHPO_4$, $BaHPO_4$.

When q>0, an aluminum source material and/or silicon source material may be provided as, for example, metallic Al, AlN, $Al_2O_3$, $AlF_3$, metallic Si, $Si(NH)_2$, $Si_3N_4$, $SiO_2$ and/or SiO.

When z>0, a halide source material may be provided as the halide counter ion with, for example, the metal source material compound, e.g., metal halide, and/or as a halide of the dopant source.

The dopant source material may be, for example $EuCl_2$, $Eu_2O_3$, $EuF_3$, $EuCl_3$, $EuF_2$, $CeO_2$, $CeF_3$.

The precursor source materials may be mixed using solid state methods known to persons having ordinary skill in the art. For example, the powders of the precursor source materials may be combined and milled together to form a precursor mixture.

At S120 of FIG. 1, the mixture of precursor materials are placed into a gas pressure furnace. Oxygen and any other gasses are removed from the gas pressure furnace by purging with nitrogen gas. The precursor materials in the gas furnace are heated under nitrogen gas at a moderate, isostatic gas pressure. The nitrogen gas partial pressures used for forming the nitridophosphate compounds may be in range of the 2-300 MPa. The gas used in the pressurizing gas furnace during the reaction may be 100% nitrogen, but may also include an inert gas, such as argon, or more rarely helium. For nitridation reactions, it is sometimes useful to "dilute" the nitrogen gas with argon gas to slow down the highly exothermic reaction, in which case a mixture of nitrogen gas and inert gas may be used. The overall pressure of such a mixture of nitrogen gas and inert gas used in the reaction may be in the range of 2-500 MPa, with the nitrogen gas partial pressure ranging from 2-300 MPa and the inert gas partial pressure ranging from 10-200 MPa. The temperatures of the furnace used for forming nitridophosphate compounds may be in the range of 800-1300° C. and the maximum temperature may be between 1000° C. and 1200° C.

The nitrogen pressure used in the hot isostatic pressing process needs to be high enough to prevent decomposition of precursor source materials, such as nitrides, under the heating, and to stabilize materials during synthesis. Conventionally, gas pressure furnaces use Argon gas, but the inventors have found that use of nitrogen gas allows the precursors to be heated, and the nitridophosphates to form from the precursors materials under the heat. At higher temperatures in the furnace, higher nitrogen pressures are used to form the nitridophosphate compounds, because the higher nitrogen pressures increase the decomposition temperature of the precursor materials, allowing higher temperatures to be used. Additionally, the decomposition temperature of the formed nitridophosphate phosphor is increased.

The amount of time necessary to form the nitridophosphate compounds under the hot, isostatic pressure reaction conditions varies with the nitridophosphate compound being synthesized, but may be between 2 to 96 hours.

Any gas pressure furnace that is able to provide heat and nitrogen gas at the required temperatures and pressures may be used. For example, commercially available hot, isostatic pressure (HIP) furnaces, such as HIP graphite furnaces may be used to form nitridophosphate compounds using the method as disclosed herein.

The method for synthesizing nitridophosphates disclosed herein has at least two advantages over conventional methods. First of all, unlike conventional methods of synthesizing nitridophosphate compounds, the method disclosed herein allows for large amounts of nitridophosphate compounds to be synthesized, which allows for commercial use of such compounds in, for example, pcLEDs. For instance, the method has allowed 12 kg of nitridophosphate to be synthesized in a single batch (one run). This makes synthesis of nitridophosphate compounds cost effective. Secondly, it was an unexpected result that the moderate nitrogen pressures can be used for synthesis of nitridophosphates. Conventional methods for synthesizing nitridophosphates may typically use nitrogen pressures exceeding 1 GPa in multi-anvil type presses. The MPa range pressures used in the method disclosed herein are in general three orders of magnitude less than conventionally used to form the nitridophosphates. The pressure used in the method is thus significantly less than 1 GPa, and may be less than 300 MPa, for example, less than 150 MPa and down to 20 MPa As S130, after returning the furnace to room temperature and pressure, the synthesized nitridophosphate may be removed from the furnace. The synthesized nitridophosphate is a crystalline material. Nitridophosphate phosphors synthesized may be used to form pcLEDs as disclosed below.

Example Reactions

The novel phosphor $Ca_2PN_3$:Eu may be synthesized by any one of the three following reactions ((a)-(c)) using the given pressure ranges (MPa), maximum temperature (° C.), and dwell times in the furnace (h=hours) ("x" indicates stoichiometric amounts in (a) and (b)):

(a) 2-x $Ca_3N_2$+$P_3N_5$+x $EuCl_2$→3 $Ca_2PN_3$:Eu (50-150 MPa $N_2$, 1000-1200° C., 10-20 h)

(b) 4-x $Ca(N_3)_2$+2 $P_{red}$+x $EuCl_2$→2 $Ca_2PN_3$:Eu+9 $N_2$ (150 MPa $N_2$, 1100-1200° C., 20-40 h)

(c) $Sr_3P_5N_{10}Cl$:Eu+2 $CaCl_2$)+$NH_4Cl$→$Ca_2PN_3$:Eu+3 $SrCl_2$+4 α-$HPN_2$ (150 MPa $N_2$, 1000° C., 10 h)

As another example, the novel phosphors $M_3P_5N_{10}X$:Eu (M=Sr, Ba; X=Cl, Br, I) may be synthesized by either of the following two reactions ((d)-(e)) using the given pressure ranges (MPa), maximum temperature (° C.), and dwell times in the furnace (h=hours) ("x" indicates stoichiometric amounts in (d) and (e)):

(d) 15-x $M(N_3)_2$+10 $P_3N_5$+3 $MX_2$+x $EuCl_2$→6 $M_3P_5N_{10}X$:Eu+40 $N_2$ (150 MPa $N_2$, 1000° C., 10 h)

(e) 5-x $M(N_3)_2$+10 P+$MX_2$+x $EuCl_2$→2 $M_3P_5N_{10}X$:Eu+5 $N_2$ (150 MPa $N_2$, 1100° C., 20 h)

Non-commercial precursors like $P_3N_5$ or $M(N_3)_2$ used for the reactions listed above can be synthesized according to literature methods (see for example supporting information of Marchuk and Schnick, *$Ba_3P_5N_{10}Br$:$Eu^{2+}$: A Natural-White-Light Single Emitter with a Zeolite Structure Type*, Angew. Chem. Int. Ed. 2015, 54, 2383-2387), and as provided in more detail in the specific examples below.

Although the examples provided herein use $Eu^{2+}$ as the dopant, if the $Eu^{2+}$ luminescence is known for a given host lattice, the $Ce^{3+}$ emission is also known. This is because the Stokes shift is a property of the host lattice. Thus, if an $Eu^{2+}$ phosphor emits in the red (green) spectral range, the $Ce^{3+}$ phosphor in the same host emits in the green yellow (blue) spectral range.

EXAMPLES

Example 1: Synthesis of $Ca_2PN_3$:Eu(3%) Using $P_3N_5$ Source Material

To form the $Ca_2PN_3$:Eu, 32.3 mg (0.22 mmole) $Ca_3N_2$ (>99%, Taiheiyo Cement Corporation), 17.73 mg (0.11 mmole) $P_3N_5$ (synthesized as described below) and 1.47 mg (>0.01 mmole) $EuCl_2$ (99.9%, Strem Chemicals) were mixed and sintered under $N_2$ atmosphere at 1500 bar and 1200° C. for 20 h in a hot isostatic gas pressure furnace. After cooling to room temperature and returning to atmospheric pressures, crystalline $Ca_2PN_3$:Eu(3%) was obtained.

The $P_3N_5$ source material was synthesized as follows: $P_4S_{10}$ (ca. 8.0 g, Sigma Aldrich 99.99%) was treated in a well dried tube furnace lined with a silica tube (Ø=5 cm) by a constant flow of dried $NH_3$ (≈3.6 l/h, Air Liquide 5.0). Initially, the apparatus was purged with $NH_3$ for 4 h and then heated up to 850° C. within 3 h. The temperature was kept for 4 h and then decreased to room temperature within 3 h again. By flushing with Ar for 1 h the remaining $NH_3$ was removed.

Example 2: Synthesis of $Ca_2PN_3$:Eu(3%) Using Elemental Phosphor Source Material To form the $Ca_2PN_3$:Eu, 64.8 mg (0.52 mmole) $Ca(N_3)_2$ (synthesized as described below), 8.1 mg (0.26 mmole) $P_{red}$ (≥99.999%, ChemPur), and 3.45 mg (0.02 mmole) $EuCl_2$ (99.9%, Strem Chemicals) were mixed and sintered under $N_2$ Atmosphere at 1500 bar and 1200° C. for 20 h in a hot isostatic gas pressure furnace. After cooling to room temperature and returning to atmospheric pressures, crystalline $Ca_2PN_3$:Eu(3%) was obtained.

To form the $Ca(N_3)_2$ the following method for synthesizing azides of Ca, Sr, and Br was used: Alkaline earth azides $M(N_3)_2$ (M=Ca, Sr, Ba) were synthesized via cation exchanger (Amberlyst 15). Diluted $HN_3$ was formed in situ by passing an aqueous solution of $NaN_3$ (Acros Organics, 99%, extra pure) through the cation exchanger. The acidic solution of $HN_3$ was dropped carefully into a stirring suspension of $MCO_3$ (M=Ca, Sr, Ba) in $H_2O$. In the case of $Ca(N_3)_2$, $CaCO_3$ (Merck, analytical grade) was used. The end of the reaction was indicated by the liquid phase, when turning completely clear. Excess of alkaline earth carbonates was filtered off and the filtrate was restricted with a rotary evaporator (50 mbar, 40° C.). The azides were obtained as colorless powders and were recrystallized from acetone for purification.

FIG. 2 is a scanning electron microscope ("SEM") image of the $Ca_2PN_3$:Eu obtained from Example 2. FIG. 2 shows bacillary particles, and the obtained $Ca_2PN_3$:Eu can be ground into powder form.

Figure 3:
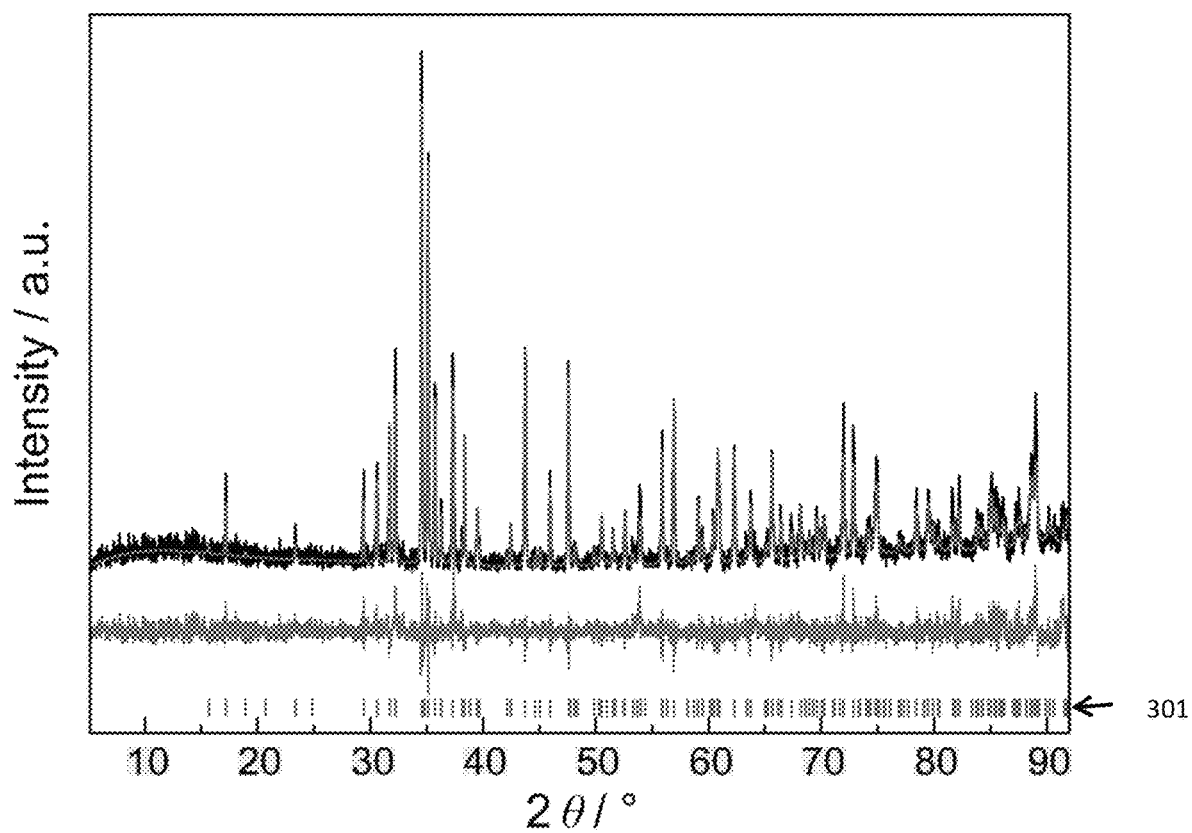
FIG. 3 shows powder X-ray diffraction ("PXRD") pattern (Cu Kα radiation) of the isolated $Ca_2PN_3$:Eu powder obtained from Example 2.

FIG. 3 shows powder X-ray diffraction ("PXRD") pattern (Cu Kα radiation) of the isolated obtained $Ca_2PN_3$:Eu powder. $Ca_2PN_3$ crystallizes in the orthorhombic space group Cmca (No. 64) with cell parameters of a=5.1908, b=10.3132 and c=11.2845 Å. The Rietveld refinement of the obtained $Ca_2PN_3$:Eu luminescent material is also shown in FIG. 3, with the reflection positions (301) of the obtained $Ca_2PN_3$:Eu.

Table 1 summarizes the atomic parameters of the obtained $Ca_2PN_3$:Eu structure. The "Atom" in Table 1 is the species that occupies a lattice site with a specific Wyckoff position ("Wyck."). The headings "x/a," "y/b," and "z/c" in Table 1 refer to the coordinates of the atomic positions in the crystal lattice that is defined by the lattice constants a, b and c. In the orthorhombic lattice system a≠b≠c and α≠β≠γ=120°.

TABLE 1

Atomic parameters

| Atom Ox. | Wyck. | Site | S.O.F. | x/a | y/b | z/c | U [Å$^2$] |
|---|---|---|---|---|---|---|---|
| Ca1 | 8f | m.. |  | 0 | 0.05239(3) | 0.35715(3) |  |
| Ca2 | 8f | m.. |  | 0 | 0.36240(3) | 0.42593(3) |  |
| P1 | 8f | m.. |  | 0 | 0.24405(3) | 0.16524(3) |  |
| N1 | 8f | m.. |  | 0 | 0.33923(12) | 0.05050(11) |  |
| N2 | 8f | m.. |  | 0 | 0.08840(11) | 0.13966(11) |  |
| N3 | 8e | .2. |  | 1/4 | 0.28775(12) | 1/4 |  |

Figure 4:
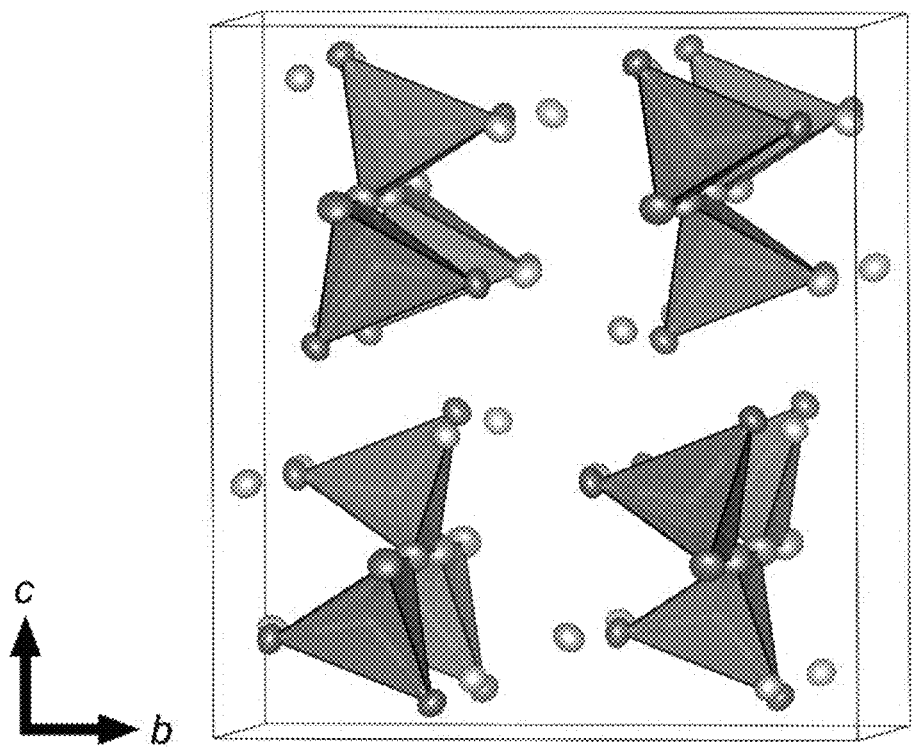
FIG. 4 is an illustration of the crystal structure of $Ca_2PN_3$.

FIG. 4 is an illustration of the crystal structure of $Ca_2PN_3$, which, as seen in FIG. 4, is built up from infinite zweier-single-chains of vertex-sharing $PN_4$ tetrahedra.

Energy-dispersive X-ray spectroscopy ("EDS") scans of the obtained $Ca_2PN_3$:Eu show a Ca:P:N ratio of 1.80:1:3.36.

Figure 5:
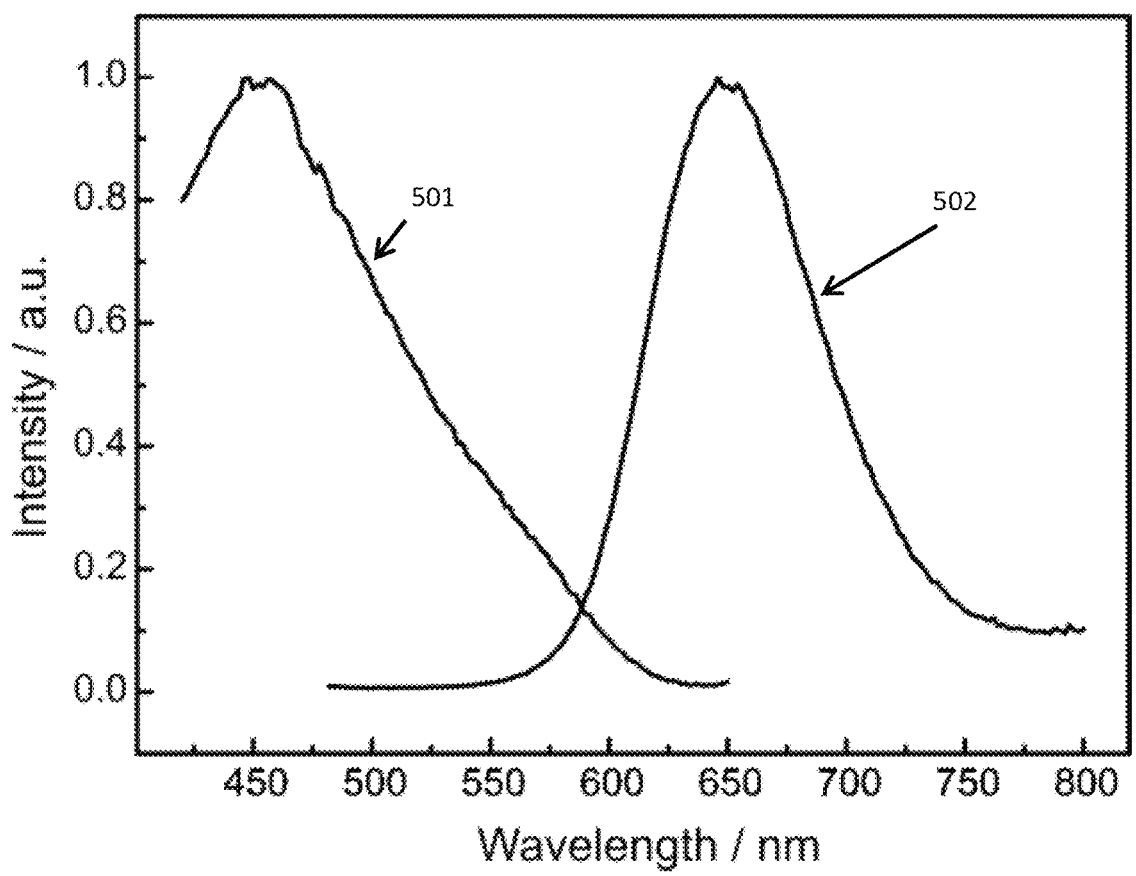
FIG. 5 shows the normalized excitation and emission spectra of the obtained $Ca_2PN_3$:Eu.

FIG. 5 shows the normalized excitation 501 and emission 502 spectra of the obtained $Ca_2PN_3$:Eu.

Example 3: Synthesis of $Sr_3P_5N_{10}Cl$:Eu(3%) Using $P_3N_5$ Source Material

To form the $Sr_3P_5N_{10}Cl$:Eu, 43.40 mg (0.25 mmole) $Sr(N_3)_2$ (synthesized as described above with respect to Example 2, where $MCO_3$ was $SrCO_3$ (99.995%, Sigma-Aldrich)), 8.02 mg (0.05 mmole) $SrCl_2$ (>99.99%, Sigma-Aldrich), 27.47 mg (0.17 mmole) $P_3N_5$ (synthesized as described above with respect to Example 1), and 1.67 mg (~0.1 mmole) $EuCl_2$ (99.9%, Strem Chemicals) were mixed and sintered under $N_2$ Atmosphere at 1500 bar and 1000° C. for 10 h in a hot isostatic gas pressure furnace. After cooling to room temperature and returning to atmospheric pressures, crystalline $Sr_3P_5N_{10}Cl$:Eu(3%) was obtained.

Example 4: Synthesis of $Sr_3P_5N_{10}Cl$:Eu(3%) Using Elemental Phosphorus Source Material To form the $Sr_3P_5N_{10}Cl$:Eu, 60.0 mg (0.35 mmole) $Sr(N_3)_2$ (synthesized as described above with respect to Example 2, where $MCO_3$ is $SrCO_3$ (99.995%, Sigma-Aldrich)), 11.08 mg (0.07 mmole) $SrCl_2$ (>99.99%, Sigma-Aldrich), 21.66 mg (0.70 mmole) $P_{red}$ (≥99.999%, ChemPur), and 2.34 mg (0.01 mmole) $EuCl_2$ (99.9%, Strem Chemicals) were mixed and sintered under $N_2$ Atmosphere at 1500 bar and 1100° C. for 20 h in a hot isostatic gas pressure furnace. After cooling to room temperature and returning to atmospheric pressures, crystalline $Sr_3P_5N_{10}Cl$:Eu(3%) was obtained.

Figure 6:
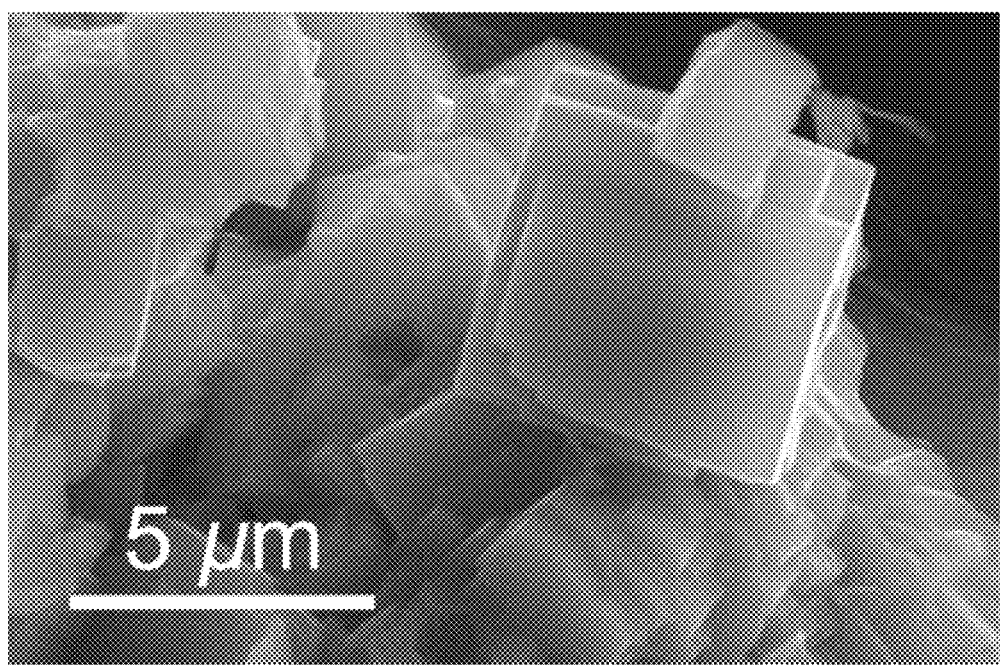
FIG. 6 is a scanning electron microscope image of the $Sr_3P_5N_{10}Cl$:Eu obtained from Example 4.

FIG. 6 is a scanning electron microscope image of the $Sr_3P_5N_{10}Cl$:Eu obtained from Example 4 (bar length, 5 m). FIG. 6 shows block-like particles of the obtained $Sr_3P_5N_{10}Cl$:Eu, which can be ground into a powder form.

Figure 7:
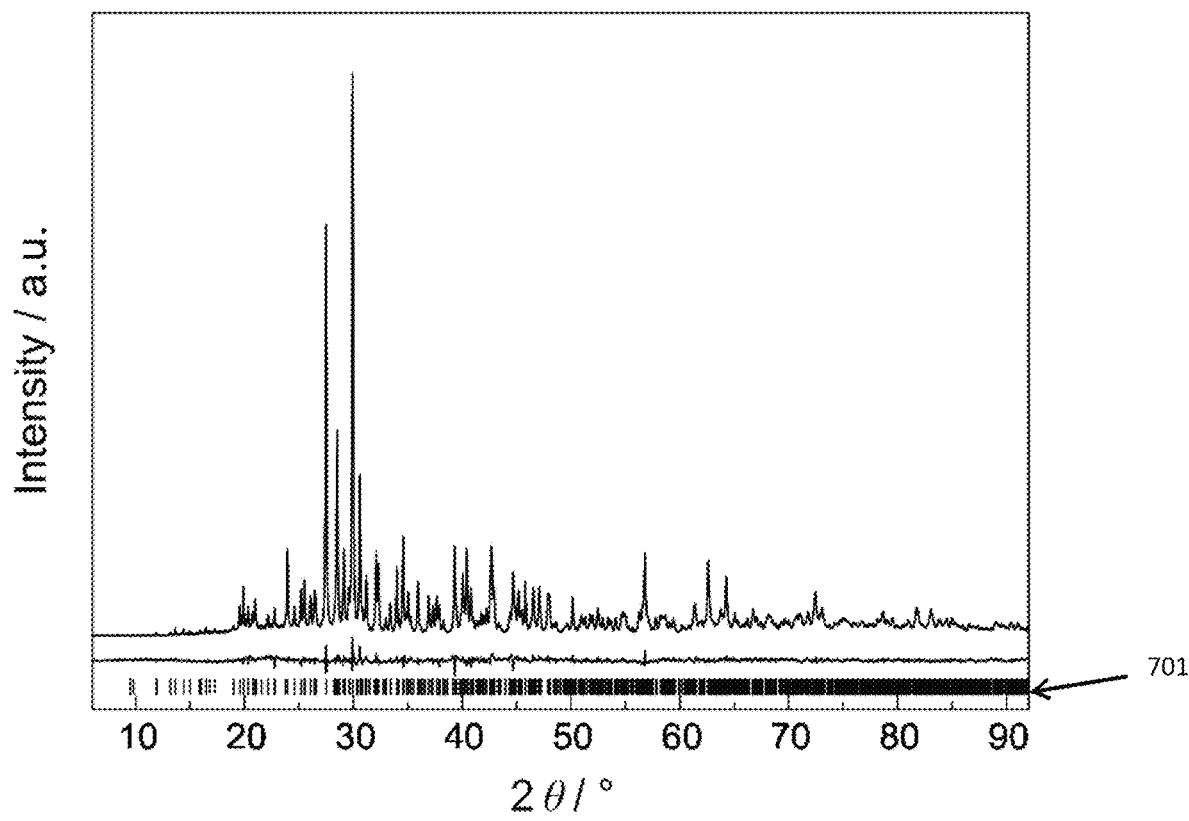
FIG. 7 shows powder X-ray diffraction pattern (Cu Kα radiation) of the isolated $Sr_3P_5N_{10}Cl$:Eu powder obtained from Example 4.

FIG. 7 shows powder X-ray diffraction pattern (Cu Kα radiation) of the isolated obtained $Sr_3P_5N_{10}Cl$:Eu powder. $Sr_3P_5N_{10}Cl$ crystallizes in the orthorhombic space group Pnma (No. 62) with cell parameters of a=12.2410, b=12.9530 and c=13.4270 Å. The Rietveld refinement of the obtained $Sr_3P_5N_{10}Cl$:Eu luminescent material is also shown in FIG. 7, with the reflection positions (701) of the obtained $Sr_3P_5N_{10}Cl$:Eu.

Table 2 summarizes the atomic parameters of the obtained $Sr_3P_5N_{10}Cl$:Eu structure. The "Atom" in Table 2 is the species that occupies a lattice site with a specific Wyckoff position ("Wyck."). The heading "S.O.F." means the site occupation factor for split positions. The headings "x/a," "y/b," and "z/c" in Table 2 refer to the coordinates of the atomic positions in the crystal lattice that is defined by the lattice constants a, b and c. In the orthorhombic lattice system a≠b≠c and α≠β≠γ≠120°.

TABLE 2

Atomic parameters

| Atom Ox. | Wyck. | Site | S.O.F. | x/a | y/b | z/c | U [Å$^2$] |
|---|---|---|---|---|---|---|---|
| Sr1 | 4c | .m. |  | 0.33172(5) | 1/4 | 0.02205(4) |  |
| Sr2 | 4c | .m. |  | 0.04468(5) | 1/4 | 0.24282(4) |  |
| Sr3 | 8d | 1 |  | 0.28055(3) | 0.01906(3) | 0.32357(3) |  |
| Sr4 | 4c | .m. |  | 0.03822(8) | 1/4 | 0.73014(6) |  |
| Sr5 | 4c | .m. | 0.718 | 0.33168(6) | 1/4 | 0.58681(6) |  |
| Sr6 | 4c | .m. | 0.279 | 0.35423(16) | 1/4 | 0.49125(16) |  |
| Cl1 | 4c | .m. |  | 0.29610(13) | 1/4 | 0.26353(12) |  |
| Cl2 | 4c | .m. |  | 0.27300(16) | 1/4 | 0.80318(13) |  |
| P1 | 8d | 1 |  | 0.02673(7) | 0.01216(7) | 0.63734(7) |  |
| P2 | 8d | 1 |  | 0.24937(8) | 0.50606(7) | 0.07218(7) |  |
| P3 | 8d | 1 |  | 0.07190(7) | 0.13265(7) | 0.01781(7) |  |
| P4 | 8d | 1 |  | 0.03886(7) | 0.53423(7) | 0.15045(7) |  |
| P5 | 8d | 1 |  | 0.09581(7) | 0.13385(7) | 0.47286(7) |  |
| N1 | 4c | .m. |  | 0.0791(4) | 1/4 | 0.4335(4) |  |
| N2 | 4c | .m. |  | 0.0953(4) | 1/4 | 0.0528(4) |  |
| N3 | 8d | 1 |  | 0.0737(4) | 0.0680(2) | 0.3701(2) |  |
| N4 | 8d | 1 |  | 0.3582(4) | 0.0479(2) | 0.1173(2) |  |
| N5 | 8d | 1 |  | 0.1704(4) | 0.5417(2) | 0.1652(2) |  |
| N6 | 8d | 1 |  | 0.0134(4) | 0.1153(2) | 0.5665(2) |  |
| N7 | 8d | 1 |  | 0.2218(4) | 0.1090(2) | 0.5046(2) |  |
| N8 | 8d | 1 |  | 0.0290(2) | 0.0581(2) | 0.7498(2) |  |
| N9 | 8d | 1 |  | 0.0016(4) | 0.6333(2) | 0.0822(2) |  |

TABLE 2-continued

Atomic parameters

| Atom Ox. | Wyck. | Site | S.O.F. | x/a | y/b | z/c | U [Å$^2$] |
|---|---|---|---|---|---|---|---|
| N10 | 8d | 1 | | 0.0048(4) | 0.0805(4) | 0.1117(2) | |
| N11 | 8d | 1 | | 0.3101(4) | 0.5768(2) | 0.4988(2) | |

Energy-dispersive X-ray spectroscopy scans of the obtained $Sr_3P_5N_{10}Cl:Eu$ show a Sr:P:N:Cl ratio of 2.55:4.64:9.81:1.

Figure 8:
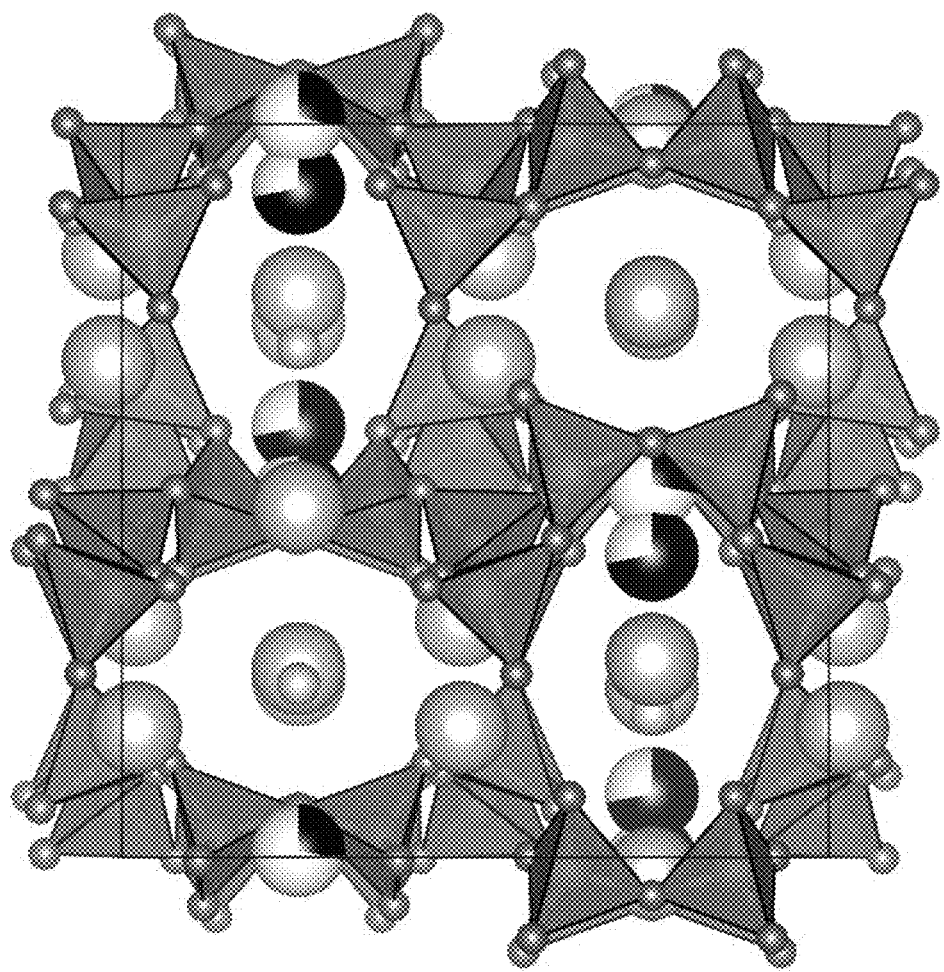
FIG. 8 is an illustration of the crystal structure of $Sr_3P_5N_{10}Cl$:Eu.

FIG. 8 is an illustration of the crystal structure of $Sr_3P_5N_{10}Cl:Eu$, which, as seen in FIG. 8, is built up from all-side vertex-sharing $PN_4$ tetrahedra. The framework topology is analogous to that of JOZ zeolite structure type. This structure type shows achter-ring channels, which are alternately filled up by Sr and Cl ions.

Figure 9:
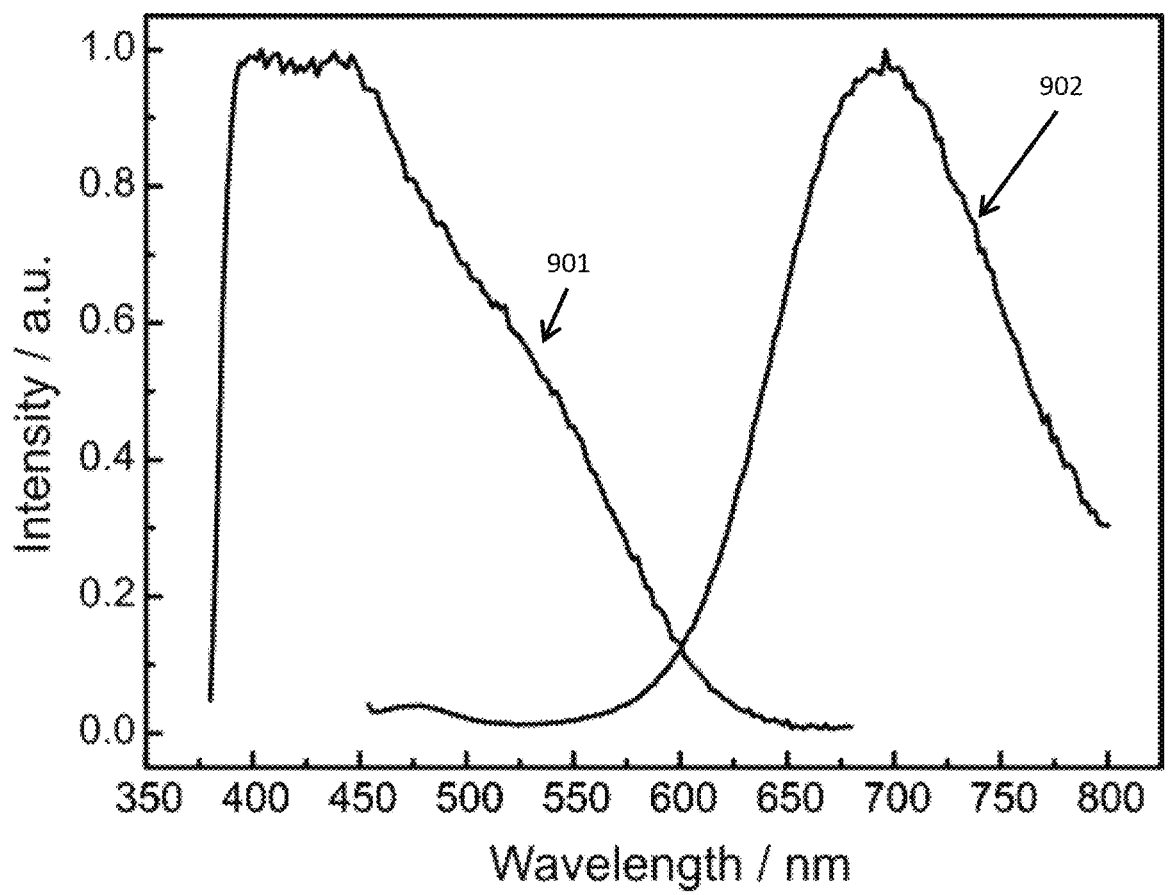
FIG. 9 shows the normalized excitation and emission spectra of the obtained $Sr_3P_5N_{10}Cl$:Eu.

FIG. 9 shows the normalized excitation 901 and emission 902 spectra of the obtained $Sr_3P_5N_{10}Cl:Eu$.

Example 5: Synthesis of $Sr_3P_5N_{10}Br:Eu$ Using $P_3N_5$ Source Material

To form the $Sr_3P_5N_{10}Br:Eu$, 40.38 mg (0.24 mmole) $Sr(N_3)_2$ (synthesized as described above with respect to Example 2, where $MCO_3$ was $SrCO_3$ (99.995%, Sigma-Aldrich)), 11.64 mg (0.05 mmole) $SrBr_2$ (99.995%, Sigma-Aldrich), 25.55 mg (0.16 mmole) $P_3N_5$ (synthesized as described above with respect to Example 1), and 1.57 mg (>0.01 mmole) $EuCl_2$ (99.9%, Strem Chemicals) were mixed and sintered under $N_2$ Atmosphere at 1500 bar and 1000° C. for 10 h in a hot isostatic gas pressure furnace. After cooling to room temperature and returning to atmospheric pressures, crystalline $Sr_3P_5N_{10}Br:Eu$ was obtained.

Example 6: Synthesis of $Sr_3P_5N_{10}Br:Eu$ Using Elemental Phosphorus Source Material To form the $Sr_3P_5N_{10}Br:Eu$, 60.0 mg (0.35 mmole) $Sr(N_3)_2$ (synthesized as disclosed above with respect to Example 2, where $MCO_3$ was $SrCO_3$ (99.995%, Sigma-Aldrich)), 17.30 mg (0.07 mmole) $SrBr_2$ (99.995%, Sigma-Aldrich), 21.65 mg (0.70 mmole) $P_{red}$ (≥99.999%, Chem-Pur), and 2.34 mg (>0.01 mmole) $EuCl_2$ (99.9%, Strem Chemicals) were mixed and sintered under $N_2$ Atmosphere at 1500 bar and 1100° C. for 20 h in a hot isostatic gas pressure furnace. After cooling to room temperature and returning to atmospheric pressures, crystalline $Sr_3P_5N_{10}Br:Eu$ was obtained.

Figure 10:
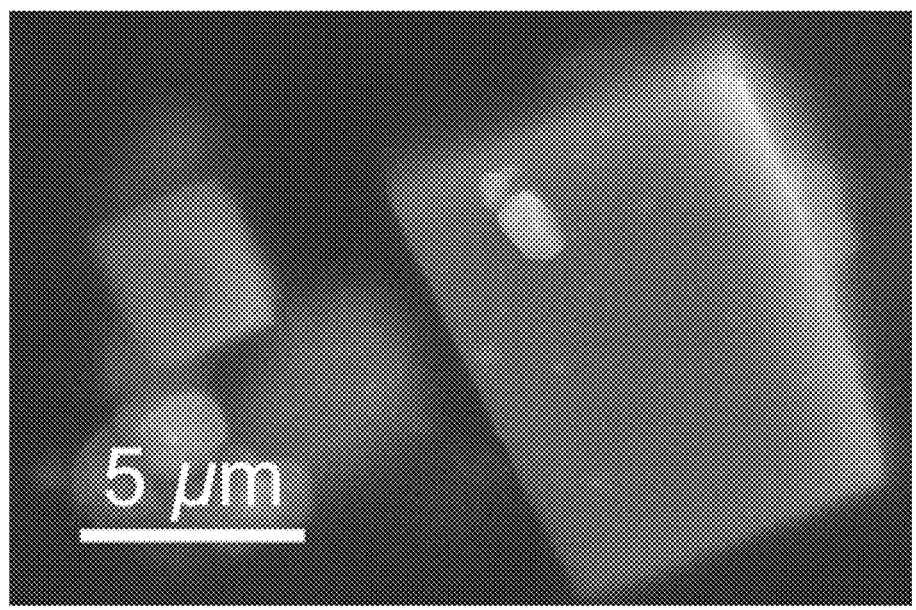
FIG. 10 is a scanning electron microscope image of the $Sr_3P_5N_{10}Br$:Eu obtained from Example 6.

FIG. 10 is a scanning electron microscope image of the $Sr_3P_5N_{10}Br:Eu$ obtained from Example 6 (bar length, 5 m). FIG. 10 shows block-like particles of the obtained $Sr_3P_5N_{10}Br:Eu$, which can be ground into a powder form.

Figure 11:
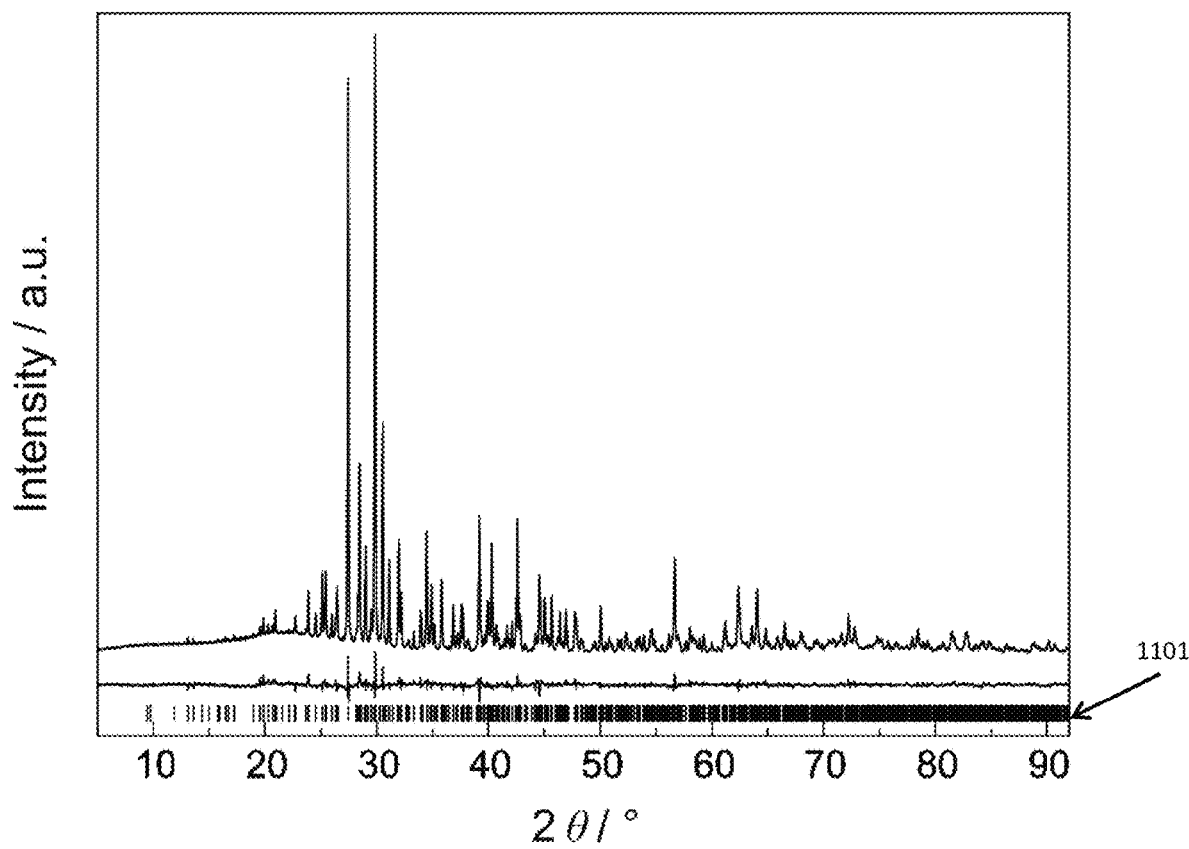
FIG. 11 shows powder X-ray diffraction pattern (Cu Kα radiation) of the isolated $Sr_3P_5N_{10}Br$:Eu powder obtained from Example 6.

FIG. 11 shows powder X-ray diffraction pattern (Cu Kα radiation) of the isolated obtained $Sr_3P_5N_{10}Br:Eu$ powder. $Sr_3P_5N_{10}Br$ crystallizes in the orthorhombic space group Pnma (No. 62) with cell parameters of a=12.2970, b=12.9896 and c=13.4585 Å. The Rietveld refinement of the obtained $Sr_3P_5N_{10}Br:Eu$ luminescent material is also shown in FIG. 11, with the reflection positions (1101) of the obtained $Sr_3P_5N_{10}Br:Eu$.

Table 3 summarizes the atomic parameters of the obtained $Sr_3P_5N_{10}Br:Eu$ structure. The "Atom" in Table 3 is the species that occupies a lattice site with a specific Wyckoff position ("Wyck."). The heading "S.O.F." means the site occupation factor for split positions. The headings "x/a," "y/b," and "z/c" in Table 3 refer to the coordinates of the atomic positions in the crystal lattice that is defined by the lattice constants a, b and c. In the orthorhombic lattice system a≠b≠c and α≠β≠γ≠120°.

TABLE 3

Atomic parameters

| Atom Ox. | Wyck. | Site | S.O.F. | x/a | y/b | z/c | B [Å$^2$] |
|---|---|---|---|---|---|---|---|
| Sr01 | 4c | .m. | | 0.3331(4) | 1/4 | 0.0261(4) | |
| Sr02 | 4c | .m. | | 0.0452(2) | 1/4 | 0.2442(4) | |
| Sr03 | 8d | 1 | | 0.27819(16) | 0.01360(17) | 0.32464(16) | |
| Sr04 | 4c | .m. | | 0.0345(4) | 1/4 | 0.7302(2) | |
| Sr05 | 4c | .m. | 0.653 | 0.3337(4) | 1/4 | 0.5731(4) | |
| Sr06 | 4c | .m. | 0.347 | 0.3487(7) | 1/4 | 0.4936(8) | |
| Br0A | 4c | .m. | | 0.2964(4) | 1/4 | 0.2647(4) | |
| Br0C | 4c | 1 | | 0.2734(4) | 1/4 | 0.8039(4) | |
| P006 | 8d | 1 | | 0.0270(5) | 0.0099(7) | 0.6367(4) | |
| P007 | 8d | 1 | | 0.2533(7) | 0.5062(7) | 0.0763(4) | |
| P008 | 8d | 1 | | 0.0741(5) | 0.1305(5) | 0.0188(4) | |
| P009 | 8d | 1 | | 0.0334(5) | 0.5333(5) | 0.1481(5) | |
| P00B | 8d | 1 | | 0.0957(7) | 0.1362(5) | 0.4746(5) | |
| N00E | 4c | 1 | | 0.082(2) | 1/4 | 0.4329(17) | |
| N00F | 4c | .m. | | 0.0896(18) | 1/4 | 0.0542(15) | |
| N00G | 8d | 1 | | 0.0652(14) | 0.0680(13) | 0.3766(11) | |
| N00H | 8d | 1 | | 0.3566(13) | 0.0472(14) | 0.1315(11) | |
| N00I | 8d | 1 | | 0.1751(13) | 0.5385(11) | 0.1659(11) | |
| N00J | 8d | 1 | | 0.0160(14) | 0.1159(13) | 0.5678(13) | |
| N00K | 8d | 1 | | 0.2126(15) | 0.1053(15) | 0.5038(13) | |
| N00L | 8d | 1 | | 0.0243(11) | 0.062(1) | 0.7512(15) | |

TABLE 3-continued

Atomic parameters

| Atom Ox. | Wyck. | Site | S.O.F. | x/a | y/b | z/c | B [Å$^2$] |
|---|---|---|---|---|---|---|---|
| N00M | 8d | 1 | | 0.5010(13) | 0.1273(13) | 0.5737(13) | |
| N00N | 8d | 1 | | 0.0092(13) | 0.0816(14) | 0.1085(11) | |
| N00O | 8d | 1 | | 0.2001(13) | 0.0825(13) | 0.0031(13) | |

Energy-dispersive X-ray spectroscopy scans of the obtained $Sr_3P_5N_{10}Br:Eu$ show a Sr:P:N:Br ratio of 2.72:4.66:7.01:1.

Figure 12:
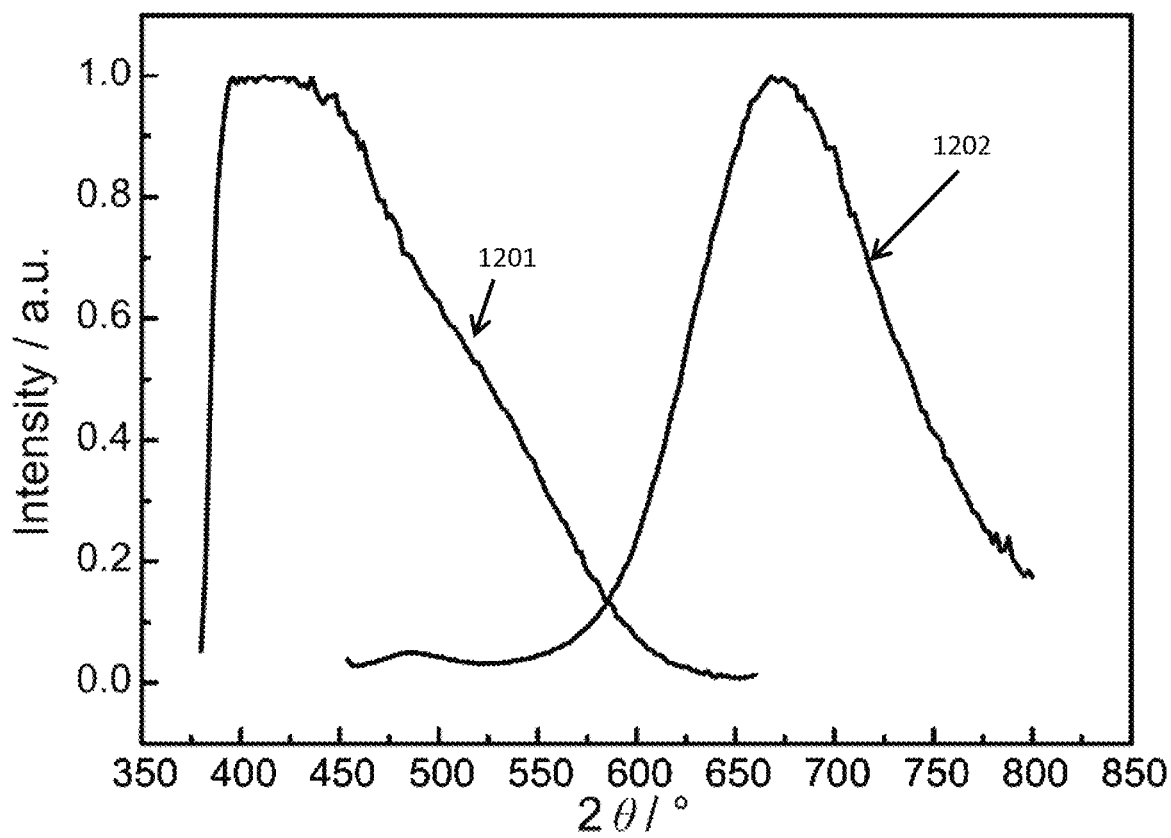
FIG. 12 shows the normalized excitation and emission spectra of the obtained $Sr_3P_5N_{10}Br$:Eu.

FIG. 12 shows the normalized excitation 1201 and emission 1202 spectra of the obtained $Sr_3P_5N_{10}Br:Eu$.

Example 7: Synthesis of $Ba_3P_5N_{10}Cl:Eu$ Using $P_3N_5$ Source Material

To form the $Ba_3P_5N_{10}Cl:Eu$, 44.73 mg (0.20 mmole) $Ba(N_3)_2$ (synthesized as described above with respect to Example 2, where $MCO_3$ was $BaCO_3$ (99.8%, Grüssing)), 8.41 mg (0.04 mmole) $BaCl_2$ (99.999%, Sigma-Aldrich), 21.95 mg (0.13 mmole) $P_3N_5$ (synthesized as described above with respect to Example 1), and 1.35 mg (>0.01 mmole) $EuCl_2$ (99.9%, Strem Chemicals) were mixed and sintered under $N_2$ Atmosphere at 1500 bar and 1000° C. for 10 h in a hot isostatic gas pressure furnace. After cooling to room temperature and returning to atmospheric pressures, crystalline $Ba_3P_5N_{10}Cl:Eu$ was obtained.

Example 8: Synthesis of $Ba_3P_5N_{10}Cl:Eu$ Using Elemental Phosphorus Source Material To form $Ba_3P_5N_{10}Cl:Eu$, 35.00 mg (0.16 mmole) $Ba(N_3)_2$ (synthesized as described above with respect to Example 2, where $MCO_3$ was $BaCO_3$ (99.8%, Grüssing)), 6.58 mg (0.03 mmole) $BaCl_2$ (99.999%, Sigma-Aldrich), 9.79 mg (0.32 mmole) $P_{red}$ (≥99.999%, ChemPur), and 1.06 mg (>0.01 mmole) $EuCl_2$ (99.9%, Strem Chemicals) were mixed and sintered under $N_2$ Atmosphere at 1500 bar and 1100° C. for 20 h in a hot isostatic gas pressure furnace. After cooling to room temperature and returning to atmospheric pressures, crystalline $Ba_3P_5N_{10}Cl:Eu$ was obtained.

Figure 13:
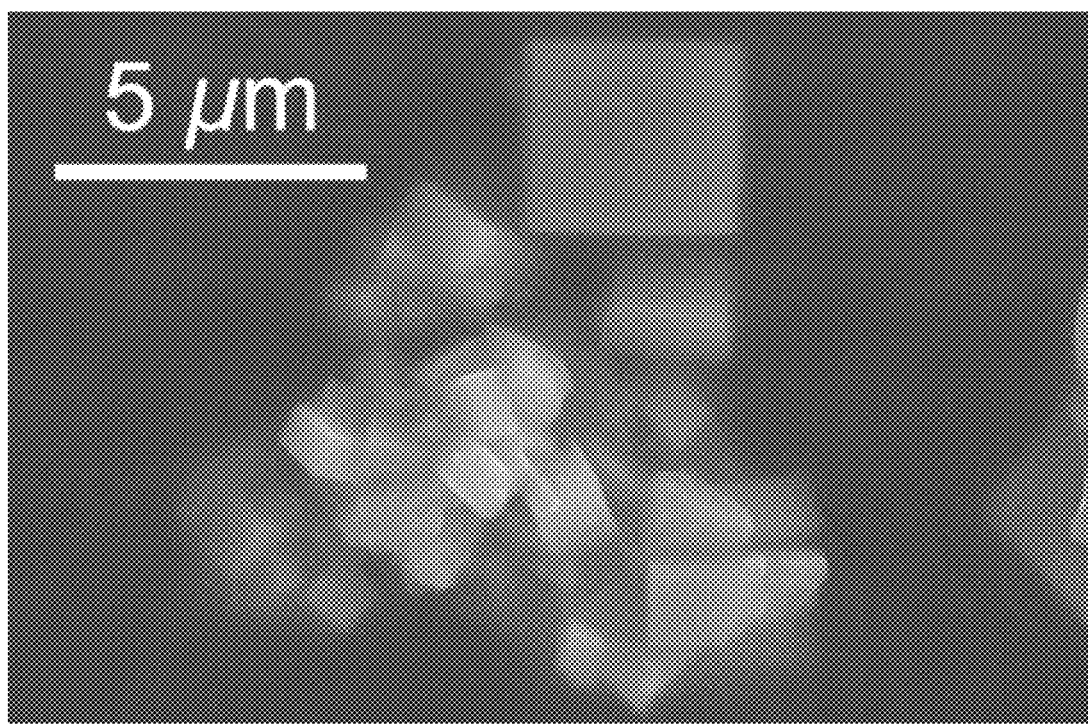
FIG. 13 is a scanning electron microscope image of the $Ba_3P_5N_{10}Cl$:Eu obtained from Example 8.

FIG. 13 is a scanning electron microscope image of the $Ba_3P_5N_{10}Cl:Eu$ obtained from Example 8 (bar length, 5 m). FIG. 13 shows block-like particles of the obtained $Ba_3P_5N_{10}Cl:Eu$, which can be ground into a powder form.

Figure 14:
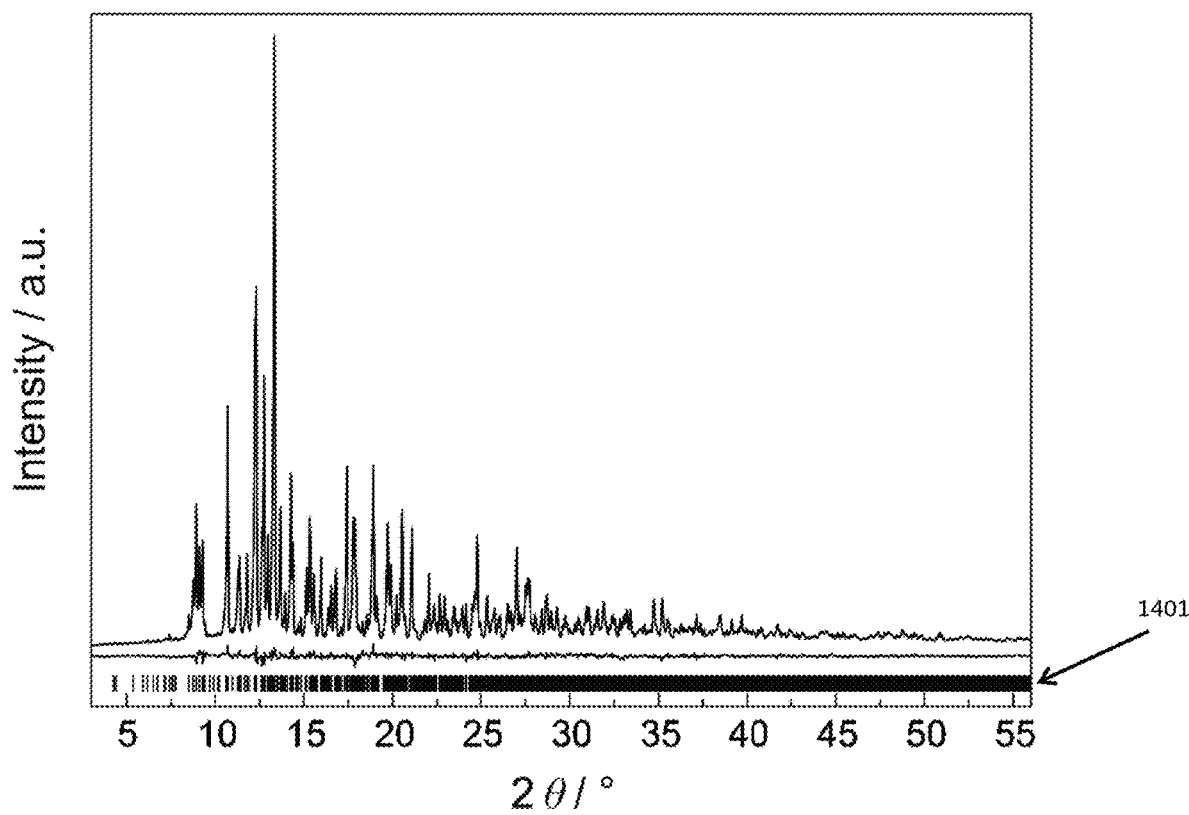
FIG. 14 shows powder X-ray diffraction pattern (Cu Kα radiation) of the isolated $Ba_3P_5N_{10}Cl$:Eu powder obtained from Example 8.

FIG. 14 shows powder X-ray diffraction pattern (Cu Kα radiation) of the isolated obtained $Ba_3P_5N_{10}Cl:Eu$ powder. $Ba_3P_5N_{10}Cl$ crystallizes in the orthorhombic space group Pnma (No. 62) with cell parameters of a=12.5458, b=13.2142 and c=13.7857 Å. The Rietveld refinement of the obtained $Ba_3P_5N_{10}Cl:Eu$ luminescent material is also shown in FIG. 14, with the reflection positions (1401) of the obtained $Ba_3P_5N_{10}Cl:Eu$.

Table 4 summarizes the atomic parameters of the obtained $Ba_3P_5N_{10}Cl:Eu$ structure. The "Atom" in Table 4 is the species that occupies a lattice site with a specific Wyckoff position ("Wyck."). The heading "S.O.F." means the site occupation factor for split positions. The headings "x/a," "y/b," and "z/c" in Table 4 refer to the coordinates of the atomic positions in the crystal lattice that is defined by the lattice constants a, b and c. In the orthorhombic lattice system a≠b≠c and α=β=γ=120°.

TABLE 4

Atomic parameters

| Atom Ox. | Wyck. Site S.O.F. | x/a | y/b | z/c | B [Å$^2$] |
|---|---|---|---|---|---|
| Ba1 | 8d 1 | 0.26849(12) | 0.00333(18) | | 0.32335(9) |
| Ba2 | 4c .m. | 0.0339(3) | 1/4 | | 0.7320(3) |
| Ba3 | 4c .m. | 0.0405(3) | 1/4 | | 0.2421(3) |
| Ba4 | 4c .m. | 0.3364(3) | 1/4 | | 0.0303(3) |
| Ba5 | 4c .m. | 0.3410(3) | 1/4 | | 0.5343(3) |
| Cl1 | 4c .m. | 0.2769(9) | 1/4 | | 0.7994(9) |
| Cl2 | 4c .m. | 0.2908(8) | 1/4 | | 0.2835(8) |
| P1 | 8d 1 | 0.02966 | 0.00322 | | 0.63972 |
| P2 | 8d 1 | 0.03587 | 0.53105 | | 0.14636 |
| P3 | 8d 1 | 0.07521 | 0.13292 | | 0.01483 |
| P4 | 8d 1 | 0.09295 | 0.13100 | | 0.48076 |
| P5 | 8d 1 | 0.24929 | 0.50182 | | 0.07337 |
| N1 | 8d 1 | 0.00510 | 0.07930 | | 0.10160 |
| N2 | 8d 1 | 0.01350 | 0.10310 | | 0.56950 |
| N3 | 8d 1 | 0.02010 | 0.04570 | | 0.74870 |
| N4 | 8d 1 | 0.05990 | 0.08360 | | 0.37470 |
| N5 | 8d 1 | 0.16490 | 0.54580 | | 0.15250 |
| N6 | 8d 1 | 0.19540 | 0.08590 | | 0.00710 |
| N7 | 8d 1 | 0.21430 | 0.09370 | | 0.50160 |
| N8 | 8d 1 | 0.35160 | 0.04710 | | 0.12810 |
| N9 | 8d 1 | 0.51620 | 0.12900 | | 0.58950 |
| N10 | 4c .m. | 0.08500 | 1/4 | | 0.04840 |
| N11 | 4c .m. | 0.07700 | 1/4 | | 0.45300 |

Energy-dispersive X-ray spectroscopy scans of the obtained $Ba_3P_5N_{10}Cl:Eu$ show a Ba:P:N:Cl ratio of 2.83:4.81:8.43:1.

Figure 15:
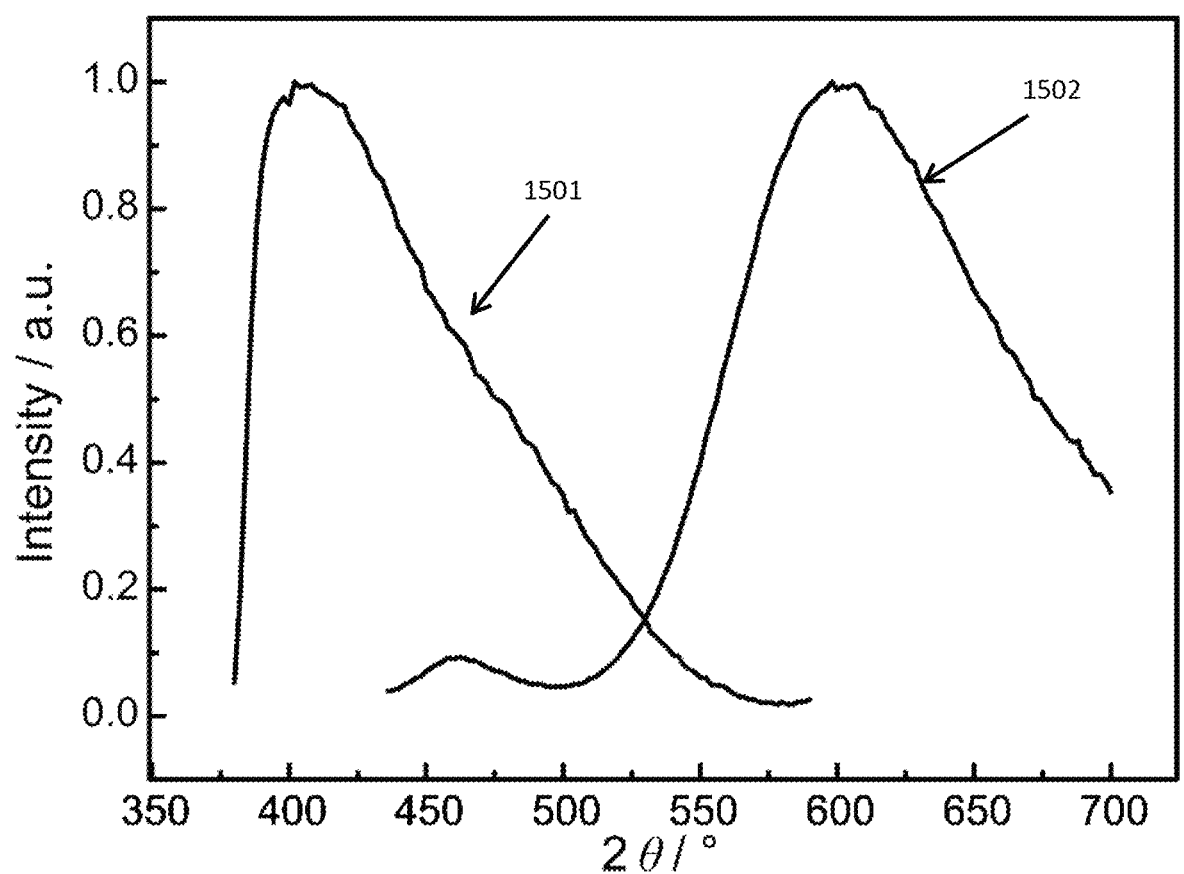
FIG. 15 shows the normalized excitation and emission spectra of the obtained $Ba_3P_5N_{10}Cl$:Eu.

FIG. 15 shows the normalized excitation 1501 and emission 1502 spectra of the obtained $Ba_3P_5N_{10}Cl:Eu$.

Example 9: Synthesis of $Ba_3P_5N_{10}Br:Eu$ Using $P_3N_5$ Source Material

To form the $Ba_3P_5N_{10}Br:Eu$, 42.20 mg (0.19 mmole) $Ba(N_3)_2$ (synthesized as described above with respect to Example 2, where $MCO_3$ was $BaCO_3$ (99.8%, Grüssing)), 11.33 mg (0.04 mmole) $BaBr_2$ (99.999%, Sigma-Aldrich), 20.71 mg (0.13 mmole) $P_3N_5$ (synthesized as described above with respect to Example 1), and 1.27 mg (>0.01 mmole) $EuCl_2$ (99.9%, Strem Chemicals) were mixed and sintered under $N_2$ Atmosphere at 1500 bar and 1000° C. for 10 h in a hot isostatic gas pressure furnace. After cooling to room temperature and returning to atmospheric pressures, crystalline $Ba_3P_5N_{10}Br:Eu$ was obtained.

Example 10: Synthesis of $Ba_3P_5N_{10}Br:Eu$ Using Elemental Phosphorus Source Material To form the $Ba_3P_5N_{10}Br:Eu$, 35.00 mg (0.16 mmole) $Ba(N_3)_2$ (synthesized as described above with respect to Example 2, where $MCO_3$ is $BaCO_3$ (99.8%, Grüssing)), 9.40 mg (0.03 mmole) $BaBr_2$ (99.999%, Sigma-Aldrich), 9.79 mg (0.32 mmole) $P_{red}$ (≥99.999%, ChemPur), and 1.06 mg (>0.01 mmole) $EuCl_2$ (99.9%, Strem Chemicals) were mixed and sintered under $N_2$ Atmosphere at 1500 bar and 1100° C. for 20 h in a hot isostatic gas pressure furnace. After cooling to room temperature and returning to atmospheric pressures, crystalline $Ba_3P_5N_{10}Br:Eu$ was obtained.

Figure 16:
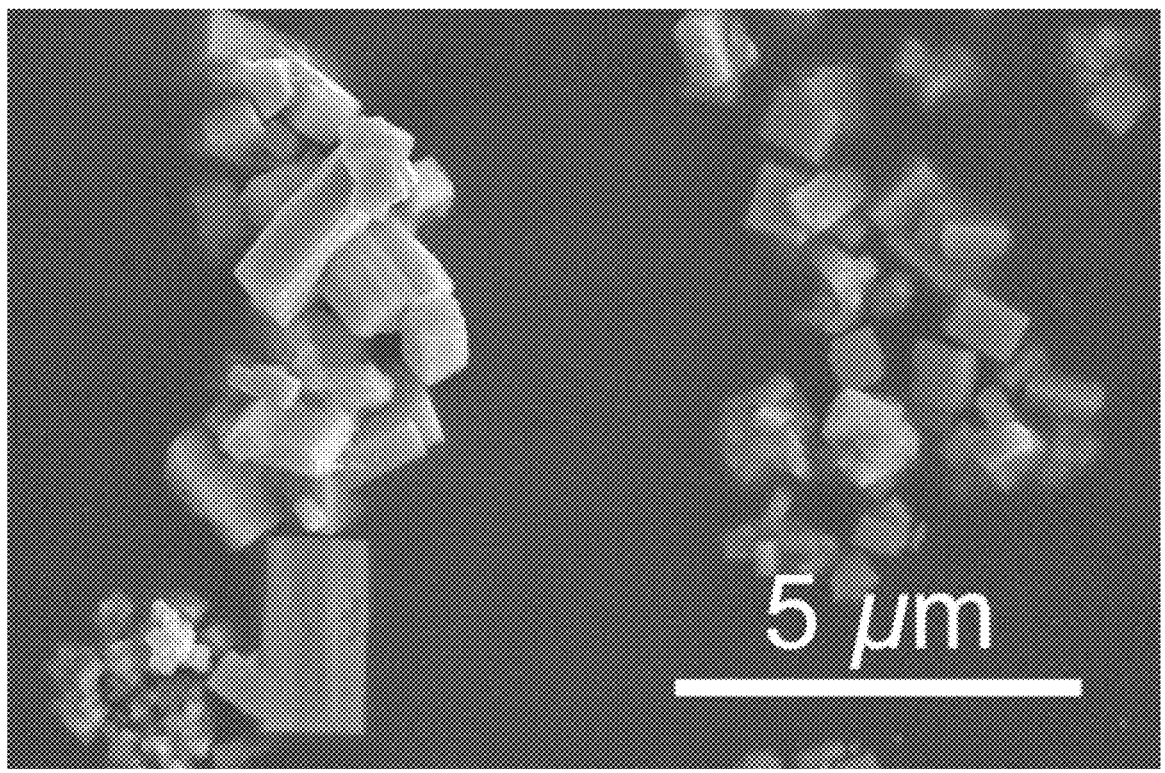
FIG. 16 is a scanning electron microscope image of the $Ba_3P_5N_{10}Br$:Eu obtained from Example 10.

FIG. 16 is a scanning electron microscope image of the $Ba_3P_5N_{10}Br:Eu$ obtained from Example 10 (bar length, 5 m). FIG. 16 shows block-like particles of the obtained $Ba_3P_5N_{10}Br:Eu$, which can be ground into a powder form.

Figure 17:
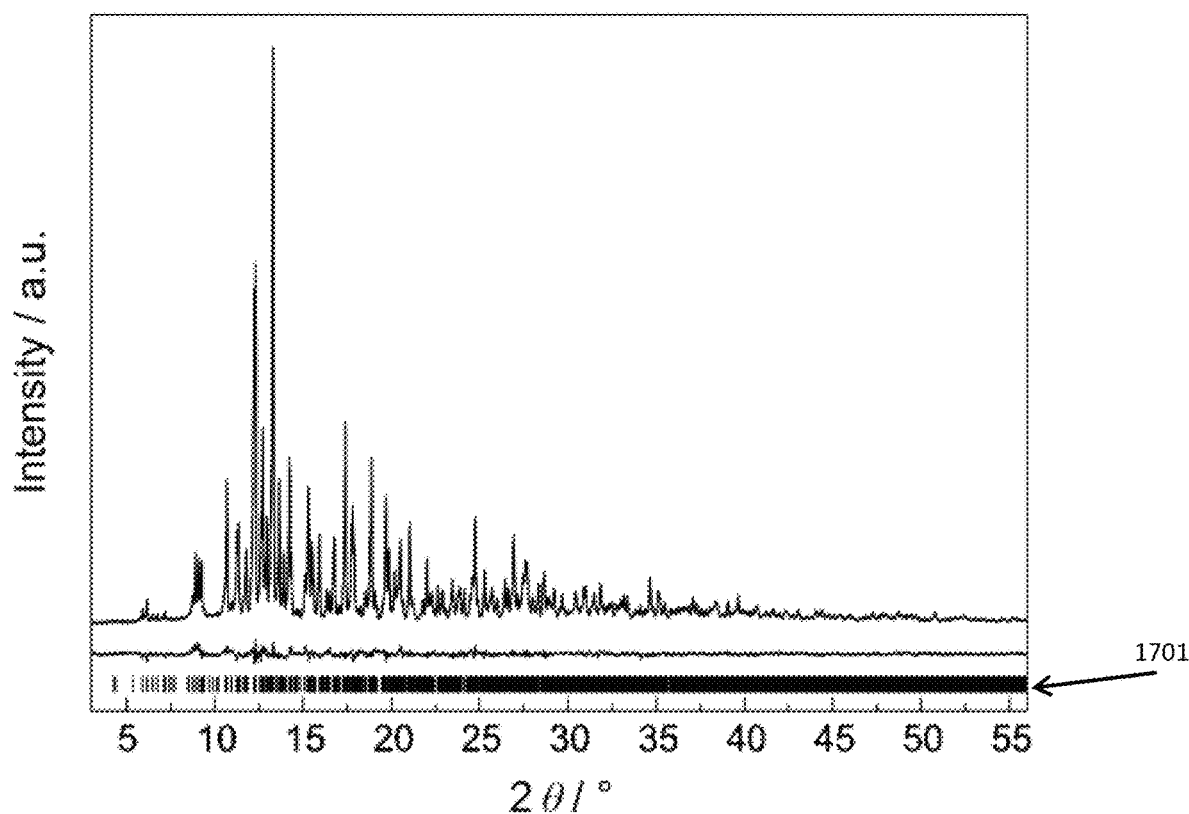
FIG. 17 shows powder X-ray diffraction pattern (Cu Kα radiation) of the isolated $Ba_3P_5N_{10}Br$:Eu powder obtained from Example 10.

FIG. 17 shows powder X-ray diffraction pattern (Cu Kα radiation) of the isolated obtained $Ba_3P_5N_{10}Br:Eu$ powder. $Ba_3P_5N_{10}Br$ crystallizes in the orthorhombic space group Pnma (No. 62) with cell parameters of a=12.5844, b=13.2290 and c=13.8106 Å. The Rietveld refinement of the obtained $Ba_3P_5N_{10}Br:Eu$ luminescent material is also shown in FIG. 17, with the reflection positions (1701) of the obtained $Ba_3P_5N_{10}Br:Eu$.

Table 5 summarizes the atomic parameters of the obtained $Ba_3P_5N_{10}Br:Eu$ structure. The "Atom" in Table 5 is the species that occupies a lattice site with a specific Wyckoff position ("Wyck."). The heading "S.O.F." means the site occupation factor for split positions. The headings "x/a," "y/b," and "z/c" in Table 5 refer to the coordinates of the atomic positions in the crystal lattice that is defined by the lattice constants a, b and c. In the orthorhombic lattice system a≠b≠c and α=β=γ=120°.

TABLE 5

Atomic parameters

| Atom Ox. | Wyck. Site S.O.F. | x/a | y/b | z/c | B [Å²] |
|---|---|---|---|---|---|
| Ba1 | 8d | 1 | 0.2678(2) | 0.0017(4) | 0.32348(13) |
| Ba2 | 4c | .m. | 0.0328(4) | 1/4 | 0.7287(4) |
| Ba3 | 4c | .m. | 0.0398(4) | 1/4 | 0.2382(4) |
| Ba4 | 4c | .m. | 0.3382(4) | 1/4 | 0.0331(4) |
| Ba5 | 4c | .m. | 0.3400(4) | 1/4 | 0.5394(4) |
| Br1 | 4c | .m. | 0.2716(5) | 1/4 | 0.8015(5) |
| Br2 | 4c | .m. | 0.2961(5) | 1/4 | 0.2813(5) |
| P1 | 8d | 1 | 0.0342(9) | 0.5263(9) | 0.1444(9) |
| P2 | 8d | 1 | 0.0724(8) | 0.1328(9) | 0.0201(8) |
| P3 | 8d | 1 | 0.0882(9) | 0.1297(9) | 0.4815(8) |
| P4 | 8d | 1 | 0.2455(13) | 0.000(2) | 0.0747(6) |
| P5 | 8d | 1 | 0.0313(8) | 0.0009(10) | 0.6365(9) |
| N1 | 8d | 1 | 0.00560 | 0.07910 | 0.09890 |
| N2 | 8d | 1 | 0.01180 | 0.09780 | 0.57070 |
| N3 | 8d | 1 | 0.01770 | 0.04150 | 0.74880 |
| N4 | 8d | 1 | 0.05060 | 0.09220 | 0.37610 |
| N5 | 8d | 1 | 0.16430 | 0.54500 | 0.15170 |
| N6 | 8d | 1 | 0.19500 | 0.08810 | 0.00620 |
| N7 | 8d | 1 | 0.21190 | 0.09000 | 0.50160 |
| N8 | 8d | 1 | 0.35010 | 0.04820 | 0.12990 |
| N9 | 8d | 1 | 0.51760 | 0.12730 | 0.59190 |
| N10 | 4c | .m. | 0.08380 | 1/4 | 0.04360 |
| N11 | 4c | .m. | 0.08640 | 1/4 | 0.45290 |

Energy-dispersive X-ray spectroscopy scans of the obtained $Ba_3P_5N_{10}Br:Eu$ show a Ba:P:N:Br ratio of 3.05:4.97:8.20:1.

Figure 18:
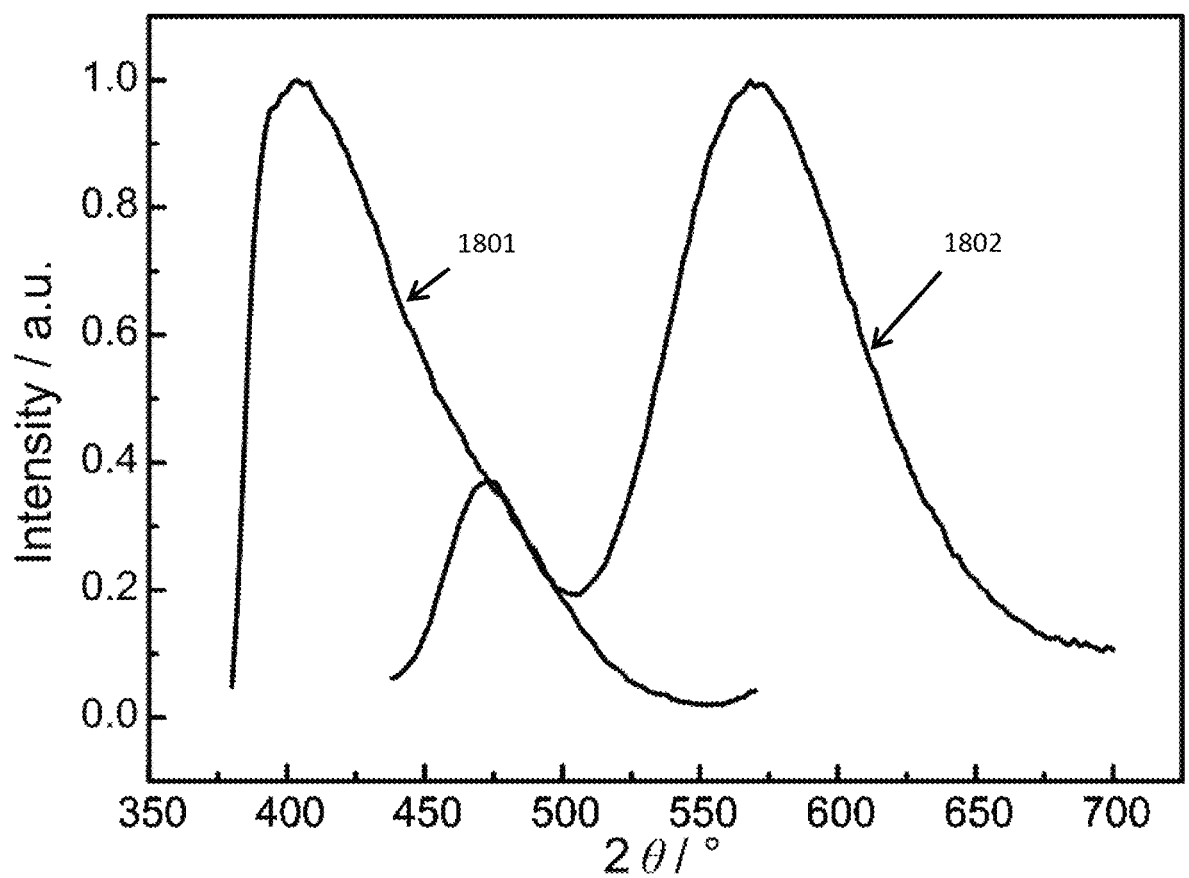
FIG. 18 shows the normalized excitation and emission spectra of the obtained $Ba_3P_5N_{10}Br$:Eu.

FIG. 18 shows the normalized excitation 1801 and emission 1802 spectra of the obtained $Ba_3P_5N_{10}Br:Eu$.

Illumination Devices Including the Nitridophosphate Phosphors

Figure 19:
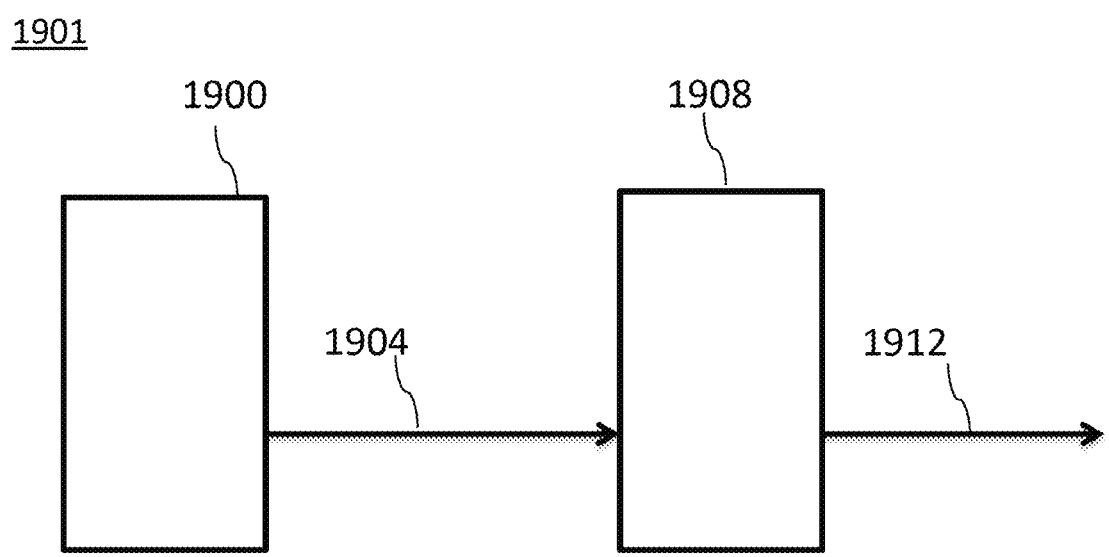
FIG. 19 illustrates a wavelength converting structure that includes at least one of the disclose nitridophosphate phosphor materials.

FIG. 19 illustrates a wavelength converting structure 1908 that includes at least one of the disclose nitridophosphate phosphor materials. Wavelength converting structure 1908 is used in an illumination device 1901. The light source 1900 may be an LED or any other suitable source including, as examples, resonant cavity light emitting diodes (RCLEDs) and vertical cavity laser diodes (VCSELs). Light source 1900 emits a first light 1904. A portion of the first light 1904 is incident upon a wavelength converting structure 1908. The wavelength converting structure 1908 absorbs the first light 1904 and emits second light 1912. The wavelength converting structure 1908 may be structured such that little or no first light is part of the final emission spectrum from the device, though this is not required.

The wavelength converting structure 1908 described with respect to FIG. 19 can be manufactured, for example, in powder form, in ceramic form, or in any other suitable form. The wavelength converting structure 1908 may be formed into one or more structures that are formed separately from and can be handled separately from the light source, such as a prefabricated glass or ceramic tile, or may be formed into a structure that is formed in situ with the light source, such as a conformal or other coating formed on or above the source.

The wavelength converting structure 1908 may be, for example, nitridophosphate phosphor powders that are dispersed for example in a transparent material, such as a silicone material, a glass matrix, a ceramic matrix, or any other suitable material or structure. Nitridophosphate phosphor dispersed in a transparent material may be formed directly on the light source, or, for example, may formed into a matrix that may be singulated or formed into a tile that is then disposed over a light source.

The invention claimed is:

1. A method of forming a luminescent nitridophosphate comprising:
    forming a precursor mixture by combining a metal source material, a phosphorus source material, a nitrogen source material, and a dopant source; and
    heating the precursor mixture at a maximum temperature between 800° C. and 1300° C. in an atmosphere consisting of nitrogen gas at a pressure between 2 MPa and 300 MPa, or consisting of a mixture of nitrogen gas at a partial pressure between 2 MPa and 300 MPa and an inert gas at a partial pressure between 10 MPa and 200 MPa, wherein the mixture of nitrogen gas and inert gas has an overall pressure between 2 MPa and 500 MPa.

2. The method of claim 1, wherein the metal source material comprises at least one of a metal azide, metal nitride, metal hydride, and metal halide, the phosphorus source material comprises at least one of elemental phosphorous, $HPN_2$, $HP_4N_7$, PON, and/or $P_3N_5$.

3. The method of claim 1, wherein the precursor mixture further includes at least one of an oxygen source material and a halide source material.

4. The method of claim 1, wherein the dopant source material comprises $EuCl_2$.

5. The method of claim 1, wherein the metal in the metal source material comprises at least one of Ca, Sr, Ba, Eu, Ce, La, Y, and Lu.

6. The method of claim 1, wherein the maximum temperature is between 1000° C. and 1200° C.

7. The method of claim 1, wherein the atmosphere consists of nitrogen gas at a pressure between 2 MPa and 300 MPa.

8. The method of claim 1, wherein the atmosphere consists of a mixture of nitrogen gas at a partial pressure between 2 MPa and 300 MPa and inert gas at a partial pressure between 10 MPa and 200 MPa.

9. The method of claim 1, wherein precursor mixture comprises at least one of $Ca_3N_2$ and Ca $(N_3)_2$, at least one of $P_3N_5$ and $P_{red}$, and $EuCl_2$.

10. The method of claim 1, wherein the precursor mixture comprises $M(N_3)_2$, at least one of $P_3N_5$ and $P_{red}$, $MX_2$, and $EuCl_2$ (M=Sr, or Ba and X=Cl, or Br).

11. A luminescent material of comprising $Ca_2PN_3$:D, where D=$Eu^{2+}$ or $Ce^{3+}$.

12. A luminescent material comprising $Sr_3P_5N_{10}X$:D, where X=F, Cl, Br, or I; and D=$Eu^{2+}$ or $Ce^{3+}$.

13. A wavelength converting structure comprising the luminescent material of claim 12.

14. The wavelength converting structure of claim 13, further comprising a light source emitting a first light, the wavelength converting structure disposed in a path of the first light, wherein luminescent phosphor absorbs the first light and emits a second light having a different wavelength than the first light.

15. A wavelength converting structure comprising the luminescent material of claim 12.

16. The wavelength converting structure of claim 15, further comprising a light source emitting a first light, the wavelength converting structure disposed in a path of the first light, wherein luminescent phosphor absorbs the first light and emits a second light having a different wavelength than the first light.

* * * * *